United States Patent
Hirzel

(10) Patent No.: US 6,301,683 B1
(45) Date of Patent: Oct. 9, 2001

(54) TRELLIS ENCODING TECHNIQUE FOR PCM MODEMS

(75) Inventor: Frederic J. Hirzel, Sunnyvale, CA (US)

(73) Assignee: Vocal Technologies, Ltd., Buffalo, NY (US)

( * ) Notice: Subject to any disclaimer, the term of this patent is extended or adjusted under 35 U.S.C. 154(b) by 0 days.

(21) Appl. No.: 09/093,704

(22) Filed: Jun. 9, 1998

Related U.S. Application Data

(60) Provisional application No. 60/049,107, filed on Jun. 9, 1997.

(51) Int. Cl.[7] ................................................... H03M 13/03
(52) U.S. Cl. .............................................................. 714/792
(58) Field of Search ..................... 714/792, 755, 714/786, 783, 800; 375/222, 265, 216, 262, 298, 296, 341, 130, 332, 285, 295, 342; 455/43

(56) References Cited

U.S. PATENT DOCUMENTS

| | | | |
|---|---|---|---|
| 4,933,956 | * 6/1990 | Forney, Jr. | 375/341 |
| 4,941,154 | 7/1990 | Wei | 375/265 |
| 4,980,897 | 12/1990 | Decker et al. | 375/265 |
| 5,119,403 | 6/1992 | Krishnan | 375/261 |
| 5,150,381 | 9/1992 | Forney, Jr. et al. | 375/261 |
| 5,233,629 | 8/1993 | Paik et al. | 375/262 |
| 5,249,200 | 9/1993 | Chen et al. | 375/285 |
| 5,251,236 | 10/1993 | Brehmer et al. | 375/298 |
| 5,295,142 | * 3/1994 | Hatakeyama | 714/794 |
| 5,321,725 | 6/1994 | Paik et al. | 375/265 |
| 5,363,408 | 11/1994 | Paik et al. | 375/261 |
| 5,396,519 | * 3/1995 | Betts et al. | 375/296 |
| 5,398,073 | 3/1995 | Wei | 348/487 |
| 5,504,479 | * 4/1996 | Doyle et al. | 340/854.9 |
| 5,559,835 | * 9/1996 | Betts | 375/265 |
| 5,659,578 | * 8/1997 | Alamouti et al. | 714/792 |
| 5,706,312 | * 1/1998 | Wei | 375/298 |
| 5,790,570 | * 8/1998 | Heegard et al. | 714/755 |
| 5,878,077 | * 3/1999 | Betts | 375/222 |
| 5,926,505 | * 7/1999 | Long | 375/222 |
| 5,953,376 | * 9/1999 | Wei | 375/265 |
| 5,995,550 | * 11/1999 | Xu et al. | 375/262 |
| 6,005,898 | * 12/1999 | Kaewell, Jr. | 375/341 |

OTHER PUBLICATIONS

Kaminsky et al (An eight–dimensional phase invariant trellis coded modulation scheme with constant envelope; IEEE; Apr. 10, 1991).*
Kaminsky et al Constant envelope eight–dimensional trellis coded modulation schemes; IEEE; Jun. 26, 1991).*
Calderbank et al (The normalized second moment of the binary lattice determined by a convolutional code; IEEE; Jan. 1994).*
Chame: A Digital Signal Processor Yields Enhanced Data/FAX Pump, IEEE, 1997.*
Rossin, et al., On the Symmetries and Structures of Trellis Codes, IEEE, 1994.*

* cited by examiner

Primary Examiner—Albert DeCady
Assistant Examiner—Guy Lamarre
(74) Attorney, Agent, or Firm—Foley & Lardner

(57) ABSTRACT

A method of applying a multidimensional error reduction/correction algorithm on a stream of one dimensional symbols, by converting the stream of one dimensional symbols into a corresponding stream of two dimensional symbols; and, applying the multidimensional error reduction/correction algorithm to the stream of two dimensional symbols. The inventions provides a method of normalizing a metric used by an error reduction/correction algorithm on a stream of symbols wherein the symbols are non-uniformly spaced, by: determining a minimum distance (dmin) between two closest symbols in the stream, for each symbol in the stream, determining a minimum distance (dsym) between the each symbol in the stream and each of its adjacent neighboring symbols, and, normalizing the metric used by the error reduction/correction algorithm by the ratio dmin/dsym.

2 Claims, 1 Drawing Sheet

TRELLIS ENCODING TECHNIQUE FOR PCM MODEMS

Applicant hereby claims the benefit under 3 U.S.C. §119(e) of U.S. Provisional Application Ser. No. 60/049,107, filed Jun. 9, 1997.

FIELD OF THE INVENTION

This invention relates generally to a trellis encoding technique for PCM modems. Even more particularly, this invention relates to a novel trellis encoding technique which is based upon International Telecommunication Union (ITU) Standard V.34, a copy of which is attached as an appendix to this application, and is to be considered an integral part thereof. The trellis encoding technique described in V.34 is based upon a trellis coding method and arrangement disclosed in U.S. Pat. No. 4,941,154, incorporated herein by reference.

BACKGROUND OF THE INVENTION

The use of trellis encoding has provided substantial advantages in digital communication. The use of trellis encoding on the analog downstream channel of PCM modems should provide similar advantages. Unfortunately, the non-equal spacing of PCM symbols results in the errors being concentrated only in those symbols with small adjacent symbol spacing.

This unequal distribution of symbol errors per symbol spacing reduces the advantages of trellis encoding. The throughput loss of including trellis state information can be compensated by an increase of throughput due to the ability to communicate error-free in a higher noise environment. Also, the use of trellis encoding may not be compatible with the variety of transmit gain and spectral shaping proposed by others.

What is needed is a trellis encoding technique which uses a modified V.34 trellis encoding for use with the analog downstream of PCM modems.

SUMMARY OF THE INVENTION

A method of applying a multidimensional error reduction/correction algorithm on a stream of one dimensional symbols, comprising converting the stream of one dimensional symbols into a corresponding stream of two dimensional symbols; and, applying the multidimensional error reduction/correction algorithm to the stream of two dimensional symbols. The invention also provides a method of normalizing a metric used by an error reduction/correction algorithm on a stream of symbols wherein the symbols are non-uniformly spaced, comprising: determining a minimum distance (dmin) between two closest symbols in the stream, for each symbol in the stream, determining a minimum distance (dsym) between the each symbol in the stream and each of its adjacent neighboring symbols, and, normalizing the metric used by the error reduction/correction algorithm by the ratio dmin/dsym.

DETAILED DESCRIPTION OF THE PREFERRED EMBODIMENT

Figure 1:
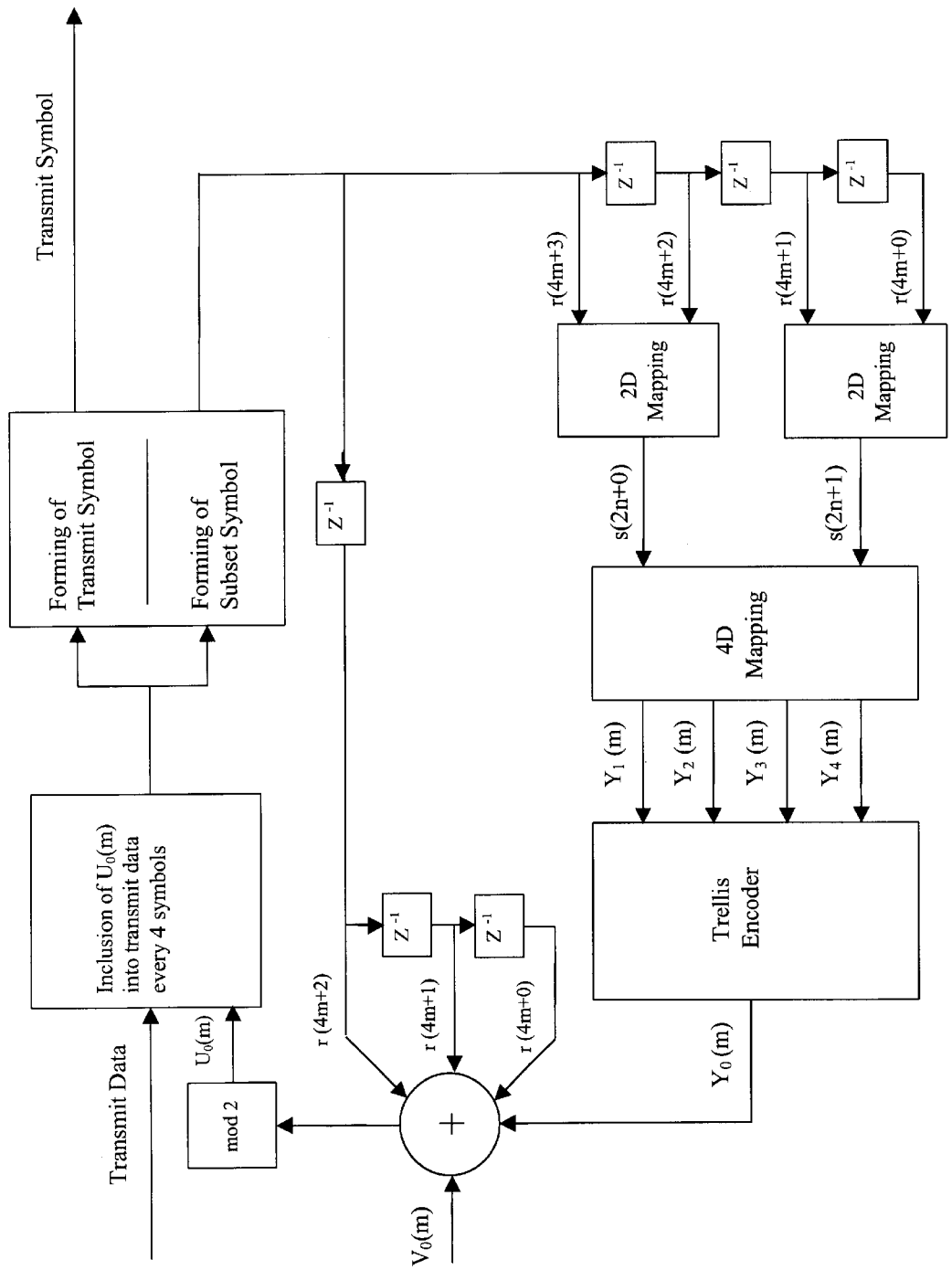
FIG. 1 is an implementation according to the present invention.

This invention discloses in FIG. 1 a modified V.34 trellis encoding for use with the analog downstream of PCM modems. In the description which follows, the symbol "D" is defined to mean "dimension" or "dimensional". For example, "1D" means "one dimensional", etc. The V.34 trellis encoding is modified for the following PCM enhancements:

A. The 4D V.34 trellis encoding is modified for 1D symbols;

B. The input PCM symbol set is partitioned into four disjoint symbol sets;

C. The trellis decoder uses weighted error (metric) information; and

D. The use of a trellis encoder for any communication is optional.

Description of the 4D V.34 Trellis Encoder for 2D Symbols

The V.34 trellis encoder is constructed to operate on two 2D symbols. The process of trellis encoding is basically defined as follows: with m indicating each 4D period, n indicating each 2D period, and t being each 1D period being created respectively:

A. Generate the first trellis encoder input y(2m).

B. Calculate $U_0(m)$ which is function of $Y_0(m)$, $V_0(m)$, and $C_0(m)$.

C. Generate the second trellis encoder input y(2m+1) including the information encoded in $U_0(m)$.

D. Map y(2m) and y(2m+1) to 2D subset labels s(2m) and s(2m+1) respectively.

E. Using s(2m) and s(2m+1), convert the subset labels to the four inputs $Y_4(m)$, $Y_3(m)$, $Y_2(m)$, and $Y_1(m)$.

F. Run the chosen systematic convolutional encoder (16 state, 32 state, 64 state) to generate $Y_0(m+1)$.

Adaptation of the 4D V.34 Trellis Encoder for 1D Symbols

The adaptation to 1D symbols is simple. It is based upon the following observations:

A. The trellis encoding need not be 90 or even 180 degrees rotationally invariant. Thus, the analogous operation of $U_0(m)$, which affects the rotation of the V.34 symbol, can now perform a transmit symbol subset selection.

The entire V.34 trellis encoding structure, namely the subsets labels s(2m), s(2m+1), $Y_4(m)$, $Y_3(m)$, $Y_2(m)$, $Y_1(m)$, and $Y_0(m)$.

C. The V.34 trellis encoding structure is so constructed that the property:

$U_0(m)$ equals bit 0 of $(s(2m) \oplus s(2m+1))$ is always satisfied.

D. Each 1D symbol can be treated as one of the independent variables of the 2D symbol y(n), either as its real or imaginary component.

The adaptation of the 4D trellis encoder to 1D symbols requires generation of subset labels analogous to the 2D s(n) subset labels. Using the notation r(t) to represent the 1D subset labels, all possible y(t) symbols are assigned r(t) values such that adjacent (in amplitude) y symbols have the following assignments:

smaller y values . . . larger y values

. . . 00 01 10 11 . . .

These assignments create four subset partitions of the set of y symbols created.

The mapping from r(t) values is then, from FIG. 9/V.34:

TABLE 1

| | r(n), r(n + 1) to s(n) mapping r(n + 1) | | | |
|---|---|---|---|---|
| r(n) | 00 | 01 | 10 | 11 |
| 11 | 001 | 110 | 101 | 010 |
| 10 | 100 | 011 | 000 | 111 |
| 01 | 101 | 010 | 001 | 110 |
| 00 | 000 | 111 | 100 | 011 |

An addition grouping of the four subsets of y are performed: those with r(t) values of 00,10, called the 0 grouping, and those with r(t) values of 01,11, called the 1 grouping.

FIG. 1 illustrates information processing in a 1D trellis encoding procedure in accordance with the invention. The trellis encoding procedure is now:

A. Generate the first trellis encoder input and output symbol y(4m) selecting from any grouping. Map the symbol to its corresponding subset label r(4m).

B. Generate the second trellis encoder input and output symbol y(4m+1) selecting from any grouping. Map the symbol to its corresponding subset label r(4m+1).

C. Generate the third trellis encoder input and output symbol y(4m+2) selecting from any grouping. Map the symbol to its corresponding subset label r(4m+2).

D. Calculate the desired $U_0(m)$ which is defined as:
$R_0(m) = $ bit 0 of $(r(4m) \oplus r(4m+1) \oplus r(4m+2))$
$U_0(m) = Y_0(m) \oplus V_0(m) \oplus R_0(m)$ E. Generate the fourth trellis encoder input and output symbol y(4m+3). The symbol must come from the 0 grouping if $U_0(m)=0$ and from the 1 grouping if $U_0(m)=1$. Map the symbol to its corresponding subset label r(4m+3).

F. Using r(4m) and r(4m+1) to its respective s(2n) value. Using r(4m+2) and r(4m+3) to respective s(2n+1) value.

G. Using s(2n) and s(2n+1), convert the subset labels to the four inputs $Y_4(m)$, $Y_3(m)$, $Y_2(m)$, and $Y_1(m)$.

Receiver Adaptation for PCM Encoding

The benefits of trellis encoding for PCM symbols can be further enhanced by scaling the metrics within the receiver. Normally, trellis encoding is used for communication systems with near equally spaced symbols for best performance over added white gaussian noise (AWGN) channels: The use of PCM codes result in symbols whose spacing is smaller for small and larger for large symbols. This results in an error on large symbols, which may be error-free without trellis encoding, to produce an error for smaller symbols.

The receiver can improve this problem. The smallest symbol spacing can be determined. This spacing, dmin, can be used to scale all other errors and hence metrics for differently spaced symbols. The scaling for any given symbol would become dmin/dsym where dsym is the spacing for a particular symbol.

This process results in large symbols contributing proportional rather than absolute information to the trellis decoding processes.

Trellis Coding Gain

The performance for equally spaced codes of the proposed trellis encoder is identical to that within V.34, approximately 4.5 dB. Unfortunately, the use of the proportionately spaced PCM codes results in less than this performance for low noise signals.

The proposed trellis encoder uses 1 bit every 4D symbol and costs ¼ bit/symbol or 2000 bits/second to operate. For low noise receive signals, it only improves the performance of those few symbols with minimum receive spacing. If the additional codes allowed by the better S/N performance does not create more than an additional ¼ bit/symbol in performance, the use of the trellis encoder is counterproductive.

For high noise receive signals, of course, the use of this trellis encoding will result in large throughput gains. Under noise representing throughput rates of 30 Kbps, the improvement can be over 4 KBps.

Because of this difference of performance of the use of trellis encoding for low and high noise PCM environments, the use of the trellis encoding should be optional. A receiver experiencing low noise can request no trellis encoding. A receiver experiencing high noise can request whatever trellis encoding it implements.

In summary, this invention describes a practical method of adapting trellis encoding for the downstream signal on PCM modems. The trellis encoder described is simply the V.34 adapted for 1D symbols. It describes improvements the receiver can make to make the trellis decoding less sensitive to the proportionally spaced PCM coded symbols. It also describes the effect low and high noise signals has on the use of trellis encoding coding gain for PCM coded symbol.

The incorporation of trellis encoding has significant advantages for high noise signals and, as such, should be incorporated into the PCM modem specification. Because of its small benefits for low noise signals, though, the specification should allow the negotiation of no trellis encoding. The PCM receiver should determine the acceptability of using trellis encoding.

These and other objects, features and advantages of the present invention will be readily apparent to those having ordinary skill in the art. For example, although a metric normalization method is described in the claims and based upon the determination of certain minimum distances between symbols in the stream, it will be appreciated that other normalization methods are also possible, based but not limited, for example, on signal level corresponding to amplitude or a function of amplitude.

What I claim is:

1. A method of normalizing a receiver metric used by an error reduction/correction algorithm on a stream of symbols wherein said symbols are non-uniformly spaced, comprising:

determining a minimum distance (dmin) between two closest symbols in said stream;

for each symbol in said stream, determining a minimum distance (dsym) between said each symbol in said stream and each of its adjacent neighboring symbols; and normalizing said receiver metric used by said error reduction/correction algorithm by the ratio dmin/dsym.

2. The method recited in claim 1 wherein said error reduction/correction algorithm is a trellis decoder.

* * * * *